United States Patent
Page et al.

[11] Patent Number: 5,284,801
[45] Date of Patent: Feb. 8, 1994

[54] METHODS OF MOISTURE PROTECTION IN SEMICONDUCTOR DEVICES UTILIZING POLYIMIDES FOR INTER-METAL DIELECTRIC

[75] Inventors: Allen Page; Anthony Sayka, both of San Antonio, Tex.

[73] Assignee: VLSI Technology, Inc., San Jose, Calif.

[21] Appl. No.: 918,739

[22] Filed: Jul. 22, 1992

[51] Int. Cl.5 .......................... H01L 23/52
[52] U.S. Cl. .................. 437/195; 437/189; 437/190
[58] Field of Search .................. 437/195, 189, 190

[56] References Cited

U.S. PATENT DOCUMENTS

| | | |
|---|---|---|
| 3,700,497 | 10/1972 | Epifano et al. . |
| 4,001,870 | 1/1977 | Saiki et al. . |
| 4,347,306 | 8/1982 | Takeda et al. . |
| 4,423,547 | 1/1984 | Farrar et al. . |
| 4,447,824 | 5/1984 | Logan et al. . |
| 4,495,220 | 1/1985 | Wolf et al. . |
| 4,541,168 | 9/1985 | Galie et al. . |
| 4,618,878 | 11/1986 | Aoyama et al. ......... 156/643 |
| 4,661,204 | 4/1987 | Mathur et al. . |
| 4,837,183 | 6/1989 | Polito et al. . |
| 4,894,351 | 1/1990 | Batty . |

*Primary Examiner*—Robert Kunemund
*Assistant Examiner*—C. Everhart
*Attorney, Agent, or Firm*—Burns, Doane, Swecker & Mathis

[57] ABSTRACT

Integrated circuits include a silicon substrate having multiple conductive metallization lines placed thereon and vertically spaced apart from each other by polyimide insulating layers wherein a moisture resistant barrier layer is completely interposed between the polyimide layers and each metallization line. The moisture resistant barrier retards corrosion of the metallization lines by reaction products formed by the release of water from the polyimide layer by reducing the amount of water which can penetrate to the metallization lines.

6 Claims, 3 Drawing Sheets

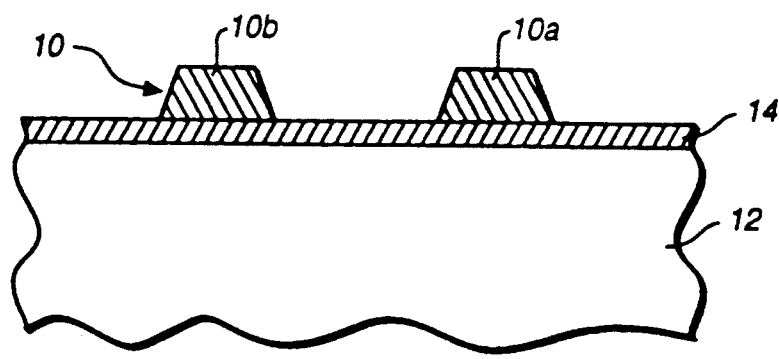
FIG._1
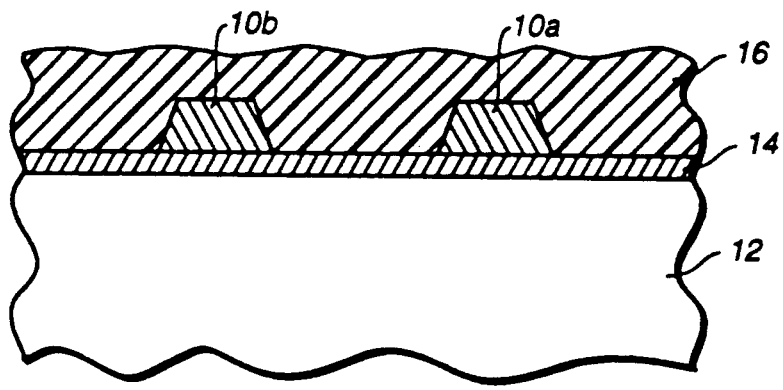
FIG._2
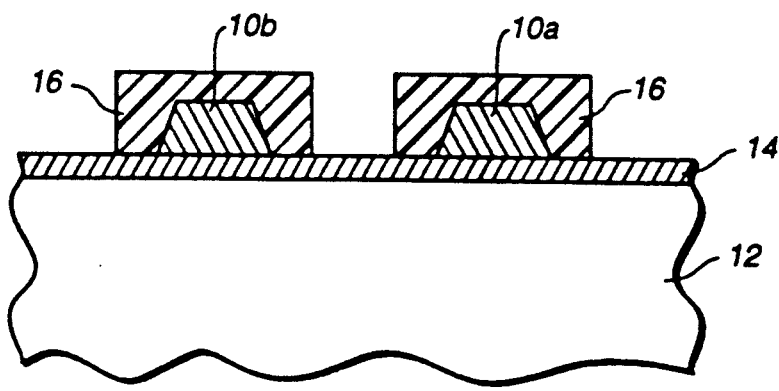
FIG._3

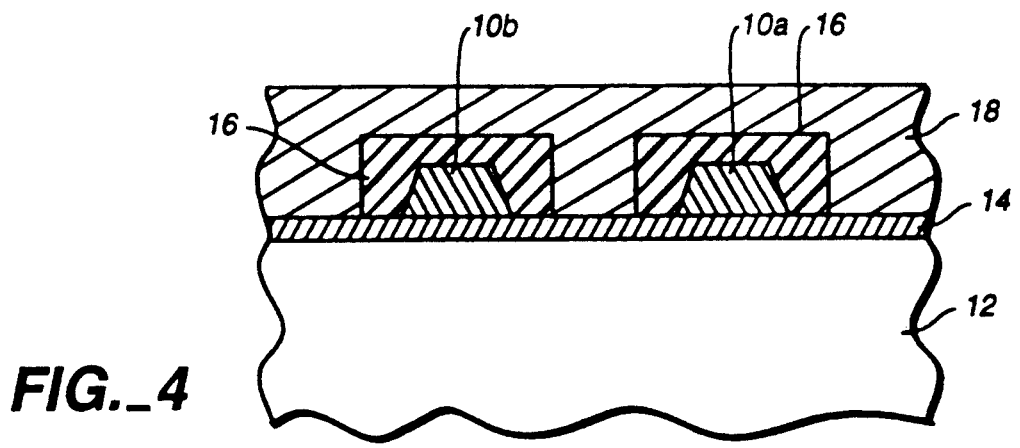
FIG._4
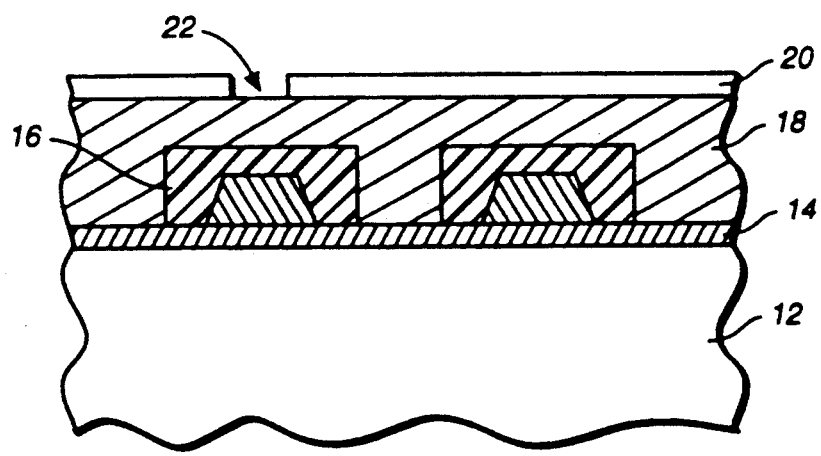
FIG._5
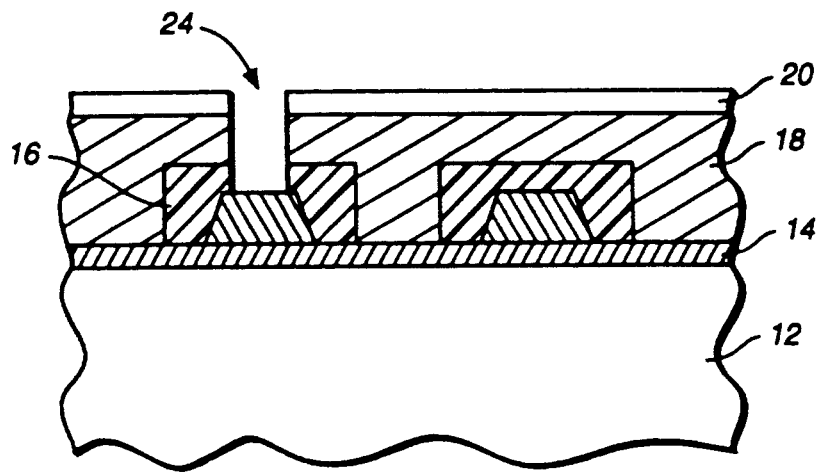
FIG._6

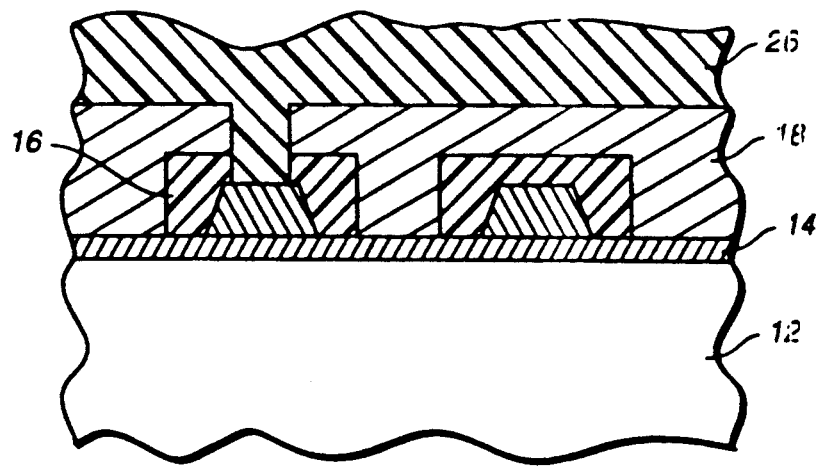
FIG._7
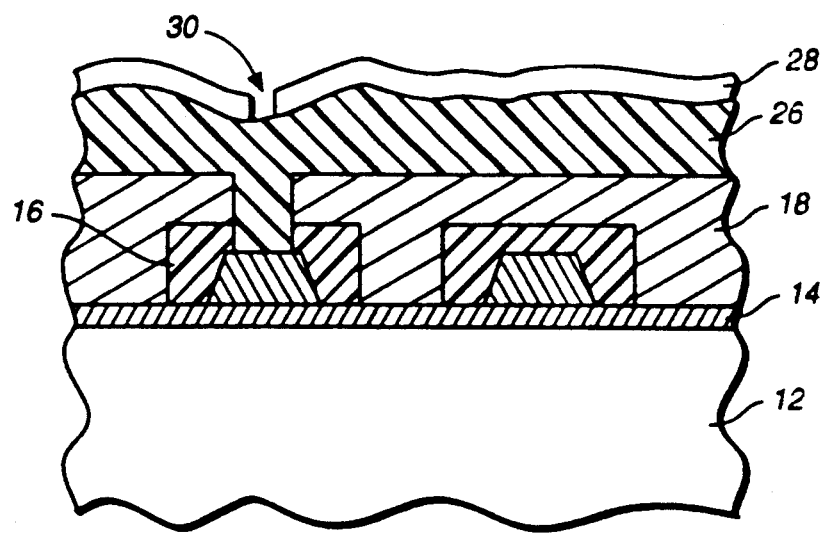
FIG._8
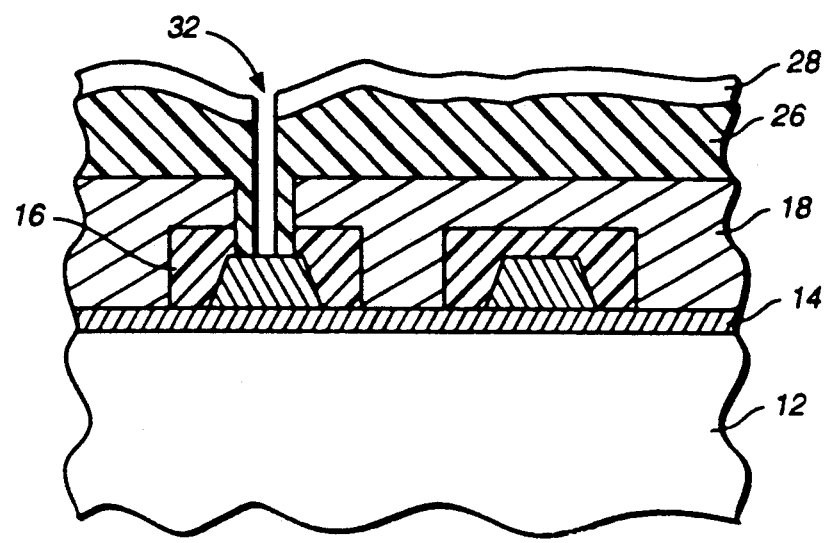
FIG._9

METHODS OF MOISTURE PROTECTION IN SEMICONDUCTOR DEVICES UTILIZING POLYIMIDES FOR INTER-METAL DIELECTRIC

BACKGROUND OF THE INVENTION

1. Field of the Invention

The present invention is directed to integrated circuits containing multiple conductive metallization lines that are spaced apart from each other by polyimide insulating layers.

2. State of the Art

Integrated circuit fabrication requires the formation and patterning of conductive metallization lines, typically aluminum or aluminum silicon, to define inter-connections between various circuit elements formed in/on the device substrate. For products having a high density of such circuit elements, such as very large scale integration (VLSI) devices, it is normally necessary to form multiple metallization lines which are vertically spaced apart and separated by intermediate insulating layers. Specifically, it is well known that if individual metallization lines cross (contact) each other, then the crossing lines will short out. Accordingly, insulating layers are employed to vertically separate such individual lines thereby preventing their contact.

The insulating layers in the above-described integrated circuits are usually formed from silicon dioxide, although polyimide insulating layers offers a number of advantages over silicon dioxide layers. For example, one problem encountered in the formation of multiple metallization lines vertically spaced apart from each other is the propagation of surface irregularities. Specifically, the patterning of each metallization line results in an uneven surface whose contours are imparted to the overlying silicon dioxide insulating layer. Since integrated circuit fabrication requires substantial planarity of the insulating layer prior to addition of the next metallization line(s), additional steps are required to planarize the surface of the silicon dioxide insulating layer prior to formation of the next metallization line(s).

It is well known, however, that an advantage of polyimide insulating layers over silicon dioxide insulating layers is that the polyimide layers smooth over the irregularities of the underlying metallization lines, providing a superior surface for applying additional metallization lines. Additionally, the polyimide insulating layers are also free from discontinuities, such as small holes, which are frequently found in silicon dioxide insulating layers. Accordingly, the use of polyimides as insulating materials between metallization lines has been suggested.

Notwithstanding the above-noted benefits of polyimides insulating layers in integrated circuits, the commercial use of such layers has been significantly deterred by the fact that during fabrication and use, polyimides can release water. The released water can react with one or more of the components found in the integrated circuit (e.g., $PO_2$ or chlorine) and generate species (e.g., acids such as $H_2PO_4$ and HCl) that can corrode the metallization lines (i.e., corrodible species). Corrosion of the metallization lines by water released from the polyimide insulating layers leads to integrated circuits with substantially reduced useful lifetimes as compared to similar integrated circuits employing silicon dioxide in the insulating layers.

SUMMARY OF THE INVENTION

The present invention, generally speaking, provides integrated circuits that contain multiple conductive metallization lines wherein a moisture resistant barrier layer is placed completely between the metallization lines and the polyimide layer so that moisture, which can be released from the polyimide layer, is retarded from interacting with and corroding the conductive metallization lines. In practice, inclusion of a moisture resistant barrier interposed completely between each metallization line and the polyimide layers imparts corrosion resistance to the metallization lines, thereby, extending the useful life of the integrated circuit as compared to similar integrated circuits not containing such moisture resistant barriers. Thus, the present invention is founded upon the discovery that metal corrosion arising from water released from the polyimide insulating layers can be significantly mitigated by placing a moisture resistant barrier layer completely between the metallization lines and the polyimide layers. The moisture resistant barrier layer, which includes nonconductive materials such as silicon dioxide and silicon nitride and conductive materials such as titanium/tungsten and platinum, inhibits the contact of water with the metallization layer and, accordingly, provides significant reduction in metal corrosion.

Accordingly, the present invention is directed to an integrated circuit comprising a silicon substrate having multiple metallization lines placed thereon and vertically spaced apart from each other by polyimide insulating layers wherein a moisture resistant barrier layer is completely interposed between the polyimide layers and each metallization line. In practice, the moisture resistant layer can be comprised of either nonconductive or conductive material and is, preferably, a material selected from the group consisting of silicon dioxide, silicon nitride, titanium/tungsten, platinum, and the like. Normally, the moisture resistant barrier has a thickness of at least about 1000 Angstroms and more preferably from about 1000 to about 2000 Angstroms. In practicing the present invention, it is ordinarily necessary to interpose a moisture resistant barrier completely between the metallization line and the polyimide layer in order to obtain the desired reduction in corrosion resistance.

The present invention also provides a method for retarding the corrosion of metallization lines in an integrated circuit comprising a silicon substrate having a passivation layer of silicon dioxide on the upper surface thereof, circuit elements located on the surface of the passivation layer, and multiple metallization lines placed on the substrate and are vertically spaced apart from each other by polyimide layers which method comprises the steps of:

(a) placing first metallization line(s) onto the surface of the passivation layer so as to connect at least two of the circuit elements located on the substrate;

(b) placing a non-conductive moisture resistant layer of at least about 1000 Angstroms onto the substrate and over the first metallization line(s);

(c) placing a polyimide insulating layer onto the substrate formed in step (b) above;

(d) applying a photoresist layer over the polyimide layer formed in step (c) above except over predetermined circuit elements;

(e) etching the substrate to form via holes which expose the predetermined circuit elements;

(f) placing a non-conductive moisture resistant layer onto the substrate formed in step (e) above;

(g) applying a photoresist layer over the moisture resistant layer formed in step (f) above except over the predetermined circuit elements of step (d);

(h) etching the substrate to form via holes which expose the predetermined circuit elements the via holes being of a smaller diameter than the via holes formed in step (e) above;

(i) removing the photoresist layer;

(j) placing second metallization line(s) onto the substrate so as to connect at least two of the predetermined circuit elements;

(k) placing a non-conductive moisture resistant layer onto the substrate and over the second metallization line(s);

(l) placing a polyimide insulating layer onto the substrate formed in step (k) above; and (m) repeat steps (d)–(l) until all of the metallization lines have been placed onto the substrate.

In the above method, the non-conductive moisture resistant layers placed onto the substrate in steps (b), (f) and (k) can optionally be etched away from the substrate, except in the area of the metallization line, prior to the subsequent steps. In such an embodiment, the etching step is conducted so as to leave at least about 1000 Angstroms, and preferably about 1000 to about 2000 Angstroms of moisture resistant layer around each of the metallization lines.

In another of its method aspects, the present invention is directed to a method for retarding the corrosion of metallization lines in an integrated circuit similar to that recited above except that a conductive moisture resistant layer is placed over the first metallization line and around the second and subsequent metallization lines. In this embodiment, the conductive moisture resistant layer is etched away from the substrate, except in over or around the metallization line, prior to formation of the polyimide layer. As before, this etching step is conducted so as to leave at least about 1000 Angstroms, and preferably about 1000 to about 2000 Angstroms of moisture resistant layer around each of the metallization lines.

BRIEF DESCRIPTION OF THE DRAWINGS

The present invention can be further understood with reference to the following description in conjunction with the appended drawings, wherein like elements are provided with the same reference numerals. In the drawings, FIGS. 1 through 9 illustrate the formation of metallization lines in an integrated circuit wherein the metallization lines are vertically spaced apart from each other by layers of polyimide and further wherein a moisture resistant barrier layer is placed completely between the polyimide layers and each metallization layer.

Specifically, FIG. 1 shows a silicon wafer having metallization lines formed on the surface of the wafer.

FIG. 2 shows the formation of a moisture resistant layer over the surface of the wafer depicted in FIG. 1.

In FIG. 3, the moisture resistant layer has been etched away so as to provide for moisture resistant layers only around the metallization lines.

FIG. 4 shows the formation of a polyimide layer over the wafer depicted in FIG. 3.

FIG. 5 shows the wafer of FIG. 4 containing a photoresist layer which layer contains exposure holes for forming vertical connect holes or via holes.

FIG. 6 shows the wafer of FIG. 5 having vertical connect holes.

FIG. 7 shows the formation of a moisture resistant layer over the wafer depicted in FIG. 6.

FIG. 8 shows the wafer of FIG. 7 containing a photoresist layer which layer contains exposure holes for forming vertical connect holes or via holes. The diameter of the exposure holes in FIG. 8 is less than that of FIG. 6 so that the new vertical connect holes are completely within the vertical connect holes formed in FIG. 6.

FIG. 9 shows the wafer of FIG. 8 having the new vertical connect holes.

DETAILED DESCRIPTION OF THE PREFERRED EMBODIMENT

In FIG. 1, a first metallization layer 10 is formed over a semiconductor substrate 12 by conventional photolithographic techniques. The substrate 12 is part of a silicon wafer which has been processed by conventional techniques to produce a plurality of individual dies or chips. In general, the entire wafer will be subject to the processing steps which are described hereinafter. The drawings, however, illustrate only a small portion of the wafer substrate.

A passivation layer 14, typically silicon dioxide formed by thermal oxidation to a thickness of about 1.0 to about 1.5 $\mu$m, is formed directly over the substrate 12 to isolate the first metallization layer 10. The metallization layer 10 is formed by evaporative deposition of a conductive metal, typically aluminum or aluminum silicon, to a thickness in the range from about 0.5 to 1.5 $\mu$m. The metallization layer 10 is then patterned by conventional lithographic techniques to form a plurality of individual interconnect or metallization lines, two of which (10a and 10b) are illustrated in FIG. 1. The metallization lines connect various circuit elements previously defined in the semiconductor substrate 12 by well known techniques.

Additional metallization lines are then formed over the first metallization line 10. To form these additional metallization lines, it will be necessary to provide polyimide insulating layers between the adjacent metallization lines, as well as to further provide vertical interconnects (via holes) through the insulation layers connecting the metallization lines with either circuit elements on the underlying substrate or with other metallization lines. A moisture resistant barrier layer is interposed completely between each of such metallization lines and the polyimide layers. The method for forming such additional metallization lines is illustrated in FIGS. 2–9.

Referring now to FIG. 2, a first moisture resistant barrier layer 16 is applied directly over the first metallization lines 10a and 10b. The moisture resistant barrier layer 16 can be derived from conductive or non-conductive materials such as titanium/tungsten and platinum (conductive) or silicon dioxide and silicon nitride (non-conductive). The particular material employed is not critical provided that it is moisture resistant.

As noted above, the polyimide layer will release water which in the presence of one or more components in the integrated circuit results in the generation of corrodible species. In the absence of a water resistant barrier, these corrodible species will corrode the metallization lines thereby reducing the useful life of the integrated circuit by as much as 50% or more as compared to the useful life of integrated circuits which are similar in all respects except that they use silicon dioxide as the dielectric material.

In the present invention, the moisture resistant barrier layer uses suitable moisture resistant materials which, when applied at a thickness of about 1000 Angstroms, will inhibit the passage of water through the barrier layer and onto the metallization line to the extent that the useful life of the integrated circuit is reduced by no more than about 20% as compared to the useful life of a similar integrated circuit which is similar in all respects except that it uses silicon dioxide as the dielectric material.

The moisture resistant barrier layer 16 can be applied by well known procedures including, by way of example, chemical vapor deposition (CVD), plasma enhanced chemical vapor deposition (PECVD), photoenhanced chemical vapor deposition, low pressure chemical vapor deposition (LPCVD), and the like. These procedures are disclosed by Wolf, "Silicon Processing for the VLSI Era", Vol. 1, Lattice Press, Sunset Beach, Calif., pp. 161–197 (1986) which is incorporated herein by reference. In general, a sufficient amount of moisture resistant material is applied so as to provide for a moisture resistant barrier layer 16 of at least about 1000 Angstroms and preferably from about 1000 to about 2000 Angstroms as measured from the surface of metallization lines 10a and 10b.

After application, a photoresist layer (not shown) is applied onto the surface of the moisture resistant barrier layers 16 but only in the position vertical to least plus or minus about 1000 Angstroms on both sides of the metallization lines 10a and 10b and preferably from plus or minus about 1000 to about 2000 Angstroms. Etching is then conducted to removed all of the moisture resistant barrier layer 16 from the surface of substrate 12 except for that found under the photoresist material. The photoresist material and etching procedure employed is not critical and any etching procedure can be employed with any compatible photoresist material. Compatible photoresist materials and etching procedures are well known in the art and are disclosed in U.S. Pat. Nos. 4,661,204; 4,495,220; and 4,423,547, the disclosures of which are incorporated herein by reference. The photoresist material is then removed so as to provide a substrate surface 12 with metallization lines 10a and 10b having a moisture resistant layer 16 over their exposed surface (i.e., the surface not in contact with the surface passivation layer 14). The resulting structure is shown in FIG. 3. Because the photoresist material vertically covered both sides of the metallization lines 10a and 10b, the resulting moisture resistant layers 16 have a minimum thickness of at least about 1000 Angstroms from any point on the metallization lines and preferably from about 1000 to about 2000 Angstroms from any point on the surface of the metallization lines.

When the moisture resistant layer 16 is composed of non-conductive material, it is not necessary to etch away the non-conductive material 16 in the above-described manner prior to application of the polyimide layer.

Referring to FIG. 4, a first insulation layer 18 is applied directly over the metallization lines 10a and 10b covered by moisture resistant barrier layers 16. The insulating layer 18 is a polyimide layer formed by conventional techniques. As shown in this figure, the use of polyimide provides for a substantially planar surface. Suitable methods for forming the polyimide insulating layer 18 are set forth in U.S. Pat. Nos. 4,661,204 and 4,495,220 both of which are incorporated herein by reference. In one embodiment, the polyimide insulating layer 18 is formed by spinning polyamic acid onto the substrate 12 over the metallization lines 10a and 10b and the moisture resistant layers 16 to a desired thickness. The thickness is usually in the range of from about 1.5 to about 3 μm. Preferably, an adhesion promoter (not shown) will be first applied over the metallization lines 10a and 10b and passivation layer 14 prior to applying the polyamic acid. After spinning, the polyamic acid is polymerized at an elevated temperature to produce the polyimide layer 18. The film is first treated at a lower temperature, typically about 150° C. for about 30 minutes, to remove excess solvents. The film is then treated at a higher temperature, typically at 350° C. for about 1 hour followed by treatment at 450° C. for about 10 minutes to produce a fully cured polyimide film having a thickness in the range of from about 0.8 to about 2.5 μm.

Suitable polyimides are available from commercial suppliers, such as Hitachi Chemical Co. and DuPont de Nemours. Particularly preferred is Dupont liquid polyamic acid PI-2555 which is diluted 4:1 with thinner T-9035 also available from Dupont. The thinned polyamic acid may be applied by spinning at 500 rpm for about 3 seconds, followed by a faster spin speed until the desired polyimide thickness is obtained. It should be noted that the polyimide film thickness decreases by approximately 40 to 50% during the high temperature cure operation, and that the loss in thickness should be accounted for in determining the initial thickness of the film. Suitable adhesion promoters include VM-651 available from DuPont de Nemours, Wilmington, Del. The adhesion promoter is employed at a concentration of about 0.1 to about 1 weight percent in a 95/5% mixture of methanol/water. The promoter is applied to the wafer substrate by spinning at 5000 rpm for about 30 seconds.

As shown in FIG. 5, after the polyimide layer 18 has been formed, a photoresist layer 20 is applied over the polyimide layer 18. Exposure holes 22 in the photoresist layer 20 are formed by exposing and developing the photoresist layer using well known techniques. The locations of the exposure holes 22 correspond to the desired location of the vertical interconnects in the polyimide layer 18. The diameter of exposure holes 22 are selected to be wider than that necessary to form a metallization line to the circuit element exposed by the vertical connect holes 24.

Once the exposure holes 22 are formed, the wafers are etched so as to produce vertical connect holes 24 as shown in FIG. 6. Afterwards, photoresist layer 20 is removed. Methods for forming the photoresist layer and for etching the wafers are well known in the art and include those set forth in U.S. Pat. No. 4,661,204 which is incorporated herein by reference in its entirety. Methods for removing the photoresist layer are also well known in the art and generally employ solvents such as ST-20, ST-22, and ST-95 available from Advanced Chemical Systems International, Inc., Milpitas, Calif. 95035.

Referring now to FIG. 7, another layer of moisture resistant material 26 is applied onto the surfaces of substrate 12 including the surfaces of vertical connect holes 24 which results in the partial or complete filling of the vertical connect holes 24 with moisture resistant material 26. Whether the vertical connect holes 24 are filled partially or completely with moisture resistant material 26 depends on factors such as the depth of vertical connect holes 24 and the amount of moisture resistant material 26. However, either embodiment is equally useful since both embodiments will coat the walls of the vertical connect holes thereby preventing contact between the polyimide layer and the metallization line(s) to be formed. In this regard, FIG. 7 depicts complete filling of the vertical connect hole 24 only for illustrative purposes.

As noted above, if the moisture resistant layer is conductive, then prior to forming vertical connect holes 32, it would be necessary to etch the moisture resistant layer away from the surface of the substrate except in the area of the to be formed vertical connect holes 32. Such etching can be conducted in the manner described above. Contrarily, if the moisture resistant material is non-conductive, then there is no need to etch the moisture resistant material away from the surface of the substrate other than in the vicinity of the to be formed vertical connect holes 32. This latter embodiment is illustrated in FIG. 8. This figure shows that after application of the layer of moisture resistant material 26, a photoresist layer 28 is applied over the surface of substrate 12. Exposure holes 30 in the photoresist layer 28 are formed by exposing and developing the photoresist layer using well known techniques. The locations of the exposure holes 30 correspond to the desired location of the vertical interconnects. The diameter of exposure holes 30 are smaller than exposure holes 22 so that the surface of vertical connect holes 32 will contain moisture resistant material.

Once the exposure holes 30 are formed, the wafers are etched so as to produce vertical connect holes 32 as shown in FIG. 9. Methods for forming the photoresist layer and for etching the wafers are well known in the art and include those set forth in U.S. Pat. No. 4,661,204 which is incorporated herein by reference in its entirety.

Once vertical connect holes 32 are formed, the photoresist layer 28 is removed and an additional metallization line is formed by evaporative deposition of a conductive metal to a thickness in the range from about 0.5 to 1.5 μm. The metallization layer is then patterned by conventional lithographic techniques as described above to form one or more individual interconnect lines which connect metallization line 10b through vertical connect hole 32.

The metallization line is then treated with a moisture resistant layer and then a polyimide layer in the manner described above. Preferably, the moisture resistant layer is etched so that the moisture resistant layer covers only an area near the additional metallization line prior to the application of the polyimide layer. The above process is repeated until all of the metallization lines have been placed onto the substrate surface.

As is apparent, the above process provides for vertical metallization lines which employ polyimide insulating layers so as to obtain the benefits of such layers while at the same time do not permit contact of the metallization lines with the polyimide layers. Such contact is prevented by the use of moisture resistant layers which retard corrosion of the metallization lines by corrodible species generated by the release of water from the polyimide layer.

The foregoing has described the principles, preferred embodiments and modes of operation of the present invention. However, the invention should not be construed as limited to the particular embodiments discussed. For example, although the preferred embodiment of the present invention has been described above in terms of a specific process application, those skilled in the art will recognize that this invention is generally applicable to any integrated circuit. Accordingly, the above-described embodiments should be regarded as illustrative rather than restrictive, and it should be appreciated that variations may be made in those embodiments by workers skilled in the art without departing from the scope of present invention as defined by the following claims.

What is claimed is:

1. A method for retarding the corrosion of metallization lines in an integrated circuit comprising a silicon substrate having a passivation layer of silicon dioxide on the upper surface thereof, circuit elements located on the surface of the passivation layer, and multiple metallization lines placed on the substrate and are vertically spaced apart from each other by polyimide insulating layers which method comprises the steps of:
    (a) placing first metallization line(s) onto the surface of the passivation layer so as to connect at least two of the circuit elements located on the substrate;
    (b) placing a non-conductive moisture resistant layer of at least about 1000 Angstroms onto the substrate and over the first metallization line(s);
    (c) placing a polyimide insulating layer onto the substrate formed in step (b) above;
    (d) applying a photoresist layer over the polyimide layer formed in step (c) above except over predetermined circuit elements;
    (e) etching the substrate to form via holes which expose the predetermined circuit elements;
    (f) placing a non-conductive moisture resistant layer onto the substrate formed in step (e) above;
    (g) applying a photoresist layer over all of the moisture resistant layer formed in step (f) above except over the predetermined circuit elements of step (d);
    (h) etching the substrate to form via holes which expose the predetermined circuit elements the via holes being of a smaller diameter than the via holes formed in step (e) above;
    (i) removing the photoresist layer;
    (j) placing second metallization line(s) onto the substrate so as to connect at least two of the predetermined circuit elements;
    (k) placing a non-conductive moisture resistant layer onto the substrate and over the second metallization line(s);
    (l) placing a polyimide insulating layer onto the substrate formed in step (k) above; and
    (m) repeat steps (d)–(l) until all of the metallization lines have been placed onto the substrate.

2. A method according to claim 1 which further comprises the steps of etching non-conductive moisture resistant layers placed onto the substrate in steps (b), (f) and (k) from the substrate, except in the area of the metallization line so as to leave at least about 1000 Angstroms around the metallization lines.

3. A method according to claim 1 wherein the non-conductive moisture resistant barrier is selected from the group consisting of silicon dioxide, silicon nitride and mixtures thereof.

4. A method according to claim 3 wherein the non-conductive moisture resistant barrier is silicon nitride.

5. A method for retarding the corrosion of metallization lines in an integrated circuit comprising a silicon substrate having a passivation layer of silicon dioxide on the upper surface thereof, circuit elements located on the surface of the passivation layer, and multiple metallization lines placed on the substrate and are vertically spaced apart from each other by polyimide insulating layers which method comprises the steps of:

(a) placing first metallization line(s) onto the surface of the passivation layer so as to connect at least two of the circuit elements located on the substrate;

(b) placing a conductive moisture resistant layer of at least about 1000 Angstroms onto the substrate and over the first metallization line(s);

(c) etching the conductive moisture resistant layers placed onto the substrate in step (b) from the substrate, except in the area of the metallization lines so as to leave at least about 1000 Angstroms around each of the metallization lines formed;

(d) placing a polyimide insulating layer onto the substrate formed in step (c) above;

(e) applying a photoresist layer over the polyimide layer formed in step (d) above except over predetermined circuit elements;

(f) etching the substrate to form via holes which expose the predetermined circuit elements;

(g) placing a conductive moisture resistant layer onto the substrate formed in step (f) above;

(h) etching the conductive moisture resistant layers placed onto the substrate in step (g) from the substrate, except in the area of the metallization line so as to leave at least about 1000 Angstroms around each of the metallization lines to be formed in step (j) below;

(i) applying a photoresist layer over all of the substrate surface formed in step (h) above except over the predetermined circuit elements of step (e);

(j) etching the substrate to form via holes which expose the predetermined circuit elements the via holes being of a smaller diameter than the via holes formed in step (f) above;

(k) removing the photoresist layer;

(l) placing second metallization line(s) onto the substrate so as to connect at least two of the predetermined circuit elements;

(m) placing a conductive moisture resistant layer onto the substrate and over the second metallization line(s);

(n) etching the conductive moisture resistant layers placed onto the substrate in step (m) from the substrate, except in the area of the metallization line so as to leave at least about 1000 Angstroms around each of the metallization lines to be formed in step (l);

(o) placing a polyimide insulating layer onto the substrate formed in step (m) above; and (p) repeat steps (d)-(o) until all of the metallization lines have been placed onto the substrate.

6. A method according to claim 5 wherein the moisture resistant conductive material is selected from the group consisting of titanium/tungsten and platinum.

* * * * *